(12) United States Patent
Hirose et al.

(10) Patent No.: US 10,611,941 B2
(45) Date of Patent: Apr. 7, 2020

(54) HEAT RADIATION SHEET, METHOD OF MANUFACTURING HEAT RADIATION SHEET, AND METHOD OF MANUFACTURING ELECTRONIC DEVICE

(71) Applicant: FUJITSU LIMITED, Kawasaki-shi, Kanagawa (JP)

(72) Inventors: Shinichi Hirose, Yokohama (JP); Yoshihiro Mizuno, Kobe (JP)

(73) Assignee: FUJITSU LIMITED, Kawasaki (JP)

( * ) Notice: Subject to any disclaimer, the term of this patent is extended or adjusted under 35 U.S.C. 154(b) by 633 days.

(21) Appl. No.: 14/926,378

(22) Filed: Oct. 29, 2015

(65) Prior Publication Data

US 2016/0130493 A1 May 12, 2016

(30) Foreign Application Priority Data

Nov. 10, 2014 (JP) .................. 2014-228221

(51) Int. Cl.
| | | |
|---|---|---|
| B32B 9/00 | (2006.01) | |
| C09K 5/14 | (2006.01) | |
| C01B 33/113 | (2006.01) | |
| C01B 32/16 | (2017.01) | |

(52) U.S. Cl.
CPC ............... C09K 5/14 (2013.01); C01B 32/16 (2017.08); C01B 33/113 (2013.01); *C01B 2202/08* (2013.01); *C01B 2202/10* (2013.01)

(58) Field of Classification Search
CPC ...... C01B 31/022–0293; Y10T 428/30; B82Y 30/00; Y10S 977/742

USPC ........... 428/408; 252/501; 423/448; 977/742
See application file for complete search history.

(56) References Cited

U.S. PATENT DOCUMENTS

| | | | | |
|---|---|---|---|---|
| 2006/0073332 A1* | 4/2006 | Huang | ................... | B82Y 10/00 428/367 |
| 2006/0234056 A1* | 10/2006 | Huang | .................. | H01L 23/373 428/408 |
| 2009/0196985 A1* | 8/2009 | Jiang | ........................ | H01B 1/04 427/118 |
| 2010/0190023 A1* | 7/2010 | Gross | .................... | H01L 23/373 428/545 |

FOREIGN PATENT DOCUMENTS

| | | |
|---|---|---|
| JP | 06-005754 | 1/1994 |
| JP | 2003-174127 | 6/2003 |
| JP | 2005-150362 | 6/2005 |
| JP | 2006-147801 | 6/2006 |

(Continued)

OTHER PUBLICATIONS

TiSiOx Coated N-Doped Carbon Nanotubes as Pt Catalyst Support for the Oxygen Reduction Reaction in PEMFCs, Banis, J. Phys. Chem. C 2013, 117, 15457-15467.*

(Continued)

*Primary Examiner* — Daniel H Miller
(74) *Attorney, Agent, or Firm* — Fujitsu Patent Center

(57) ABSTRACT

There is provided a method of manufacturing a heat radiation sheet, the method including: forming a base film on a substrate; growing a plurality of carbon nanotubes on the base film; and vaporizing at least a part of the base film by heating the base film to coat the carbon nanotube with a coating film containing a material of the vaporized base film.

7 Claims, 24 Drawing Sheets

(56) References Cited

FOREIGN PATENT DOCUMENTS

| | | |
|---|---|---|
| JP | 2006-303240 | 11/2006 |
| JP | 2013-173650 | 9/2013 |
| JP | 2013-211430 | 10/2013 |
| JP | 2014-138085 | 7/2014 |

OTHER PUBLICATIONS

JPOA—Office Action dated Apr. 17, 2018 issued with respect to the basic Japanese Patent Application No. 2014-228221 with full machine translation.

\* cited by examiner

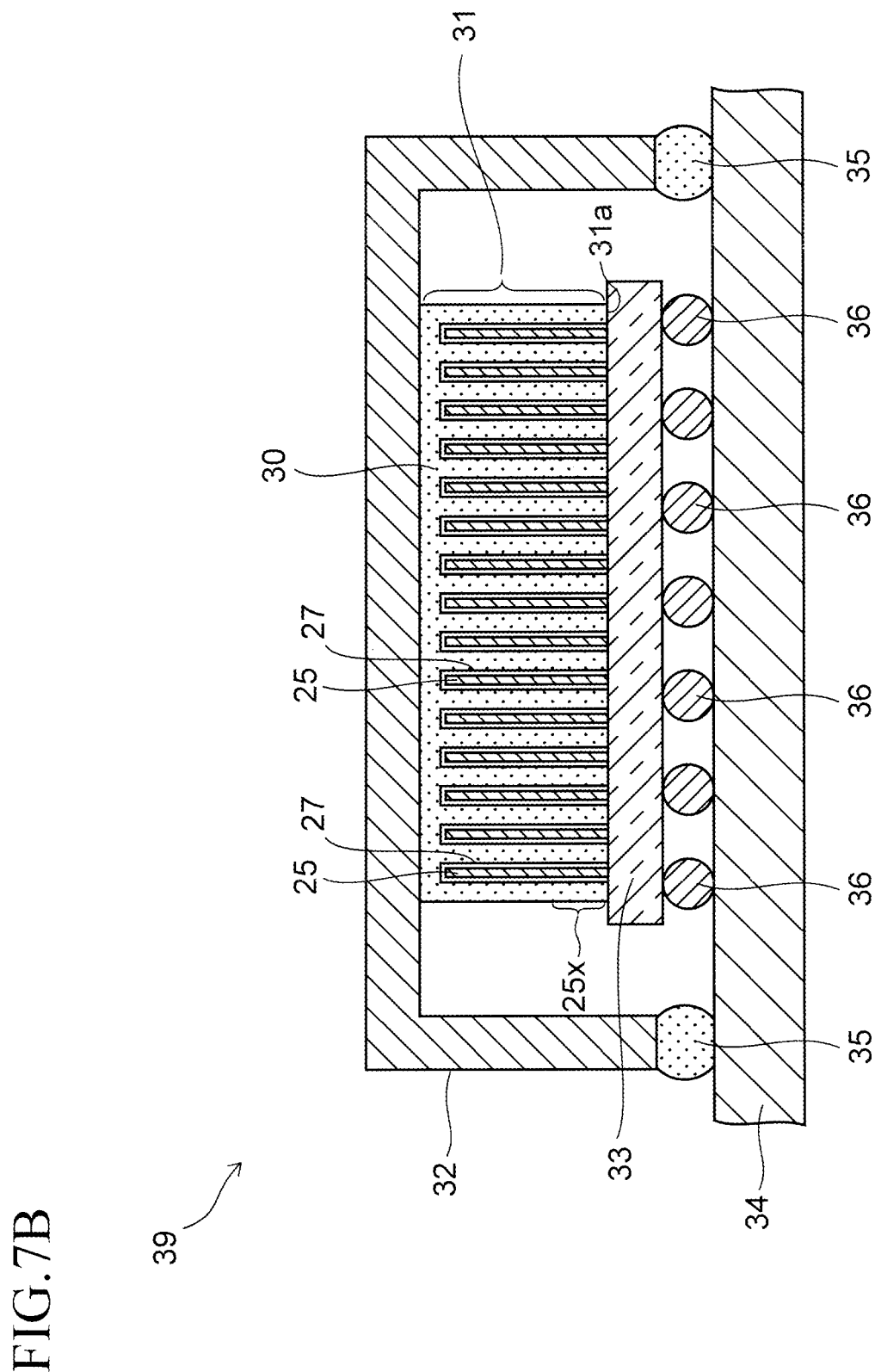

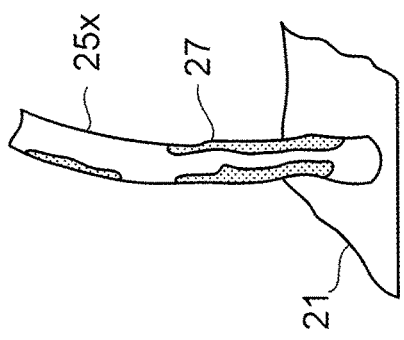
FIG.9A  T=1 MINUTE
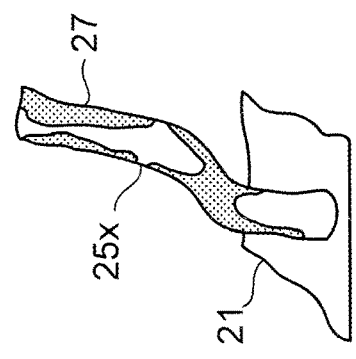
FIG.9B  T=3 MINUTES
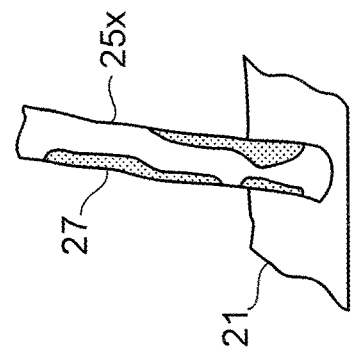
FIG.9C  T=5 MINUTES
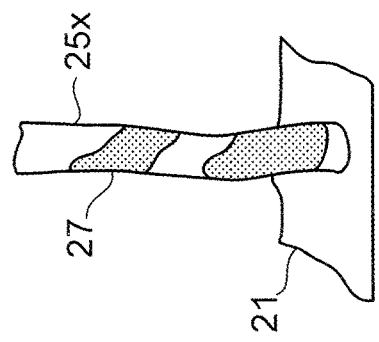
FIG.9D  T=10 MINUTES

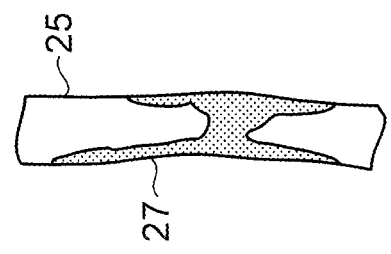
FIG.10A
T=1 MINUTE
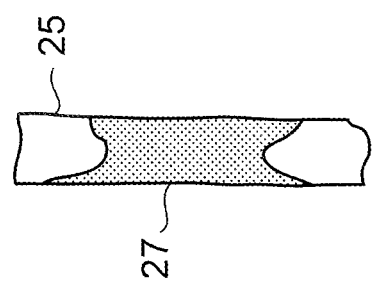
FIG.10B
T=3 MINUTES
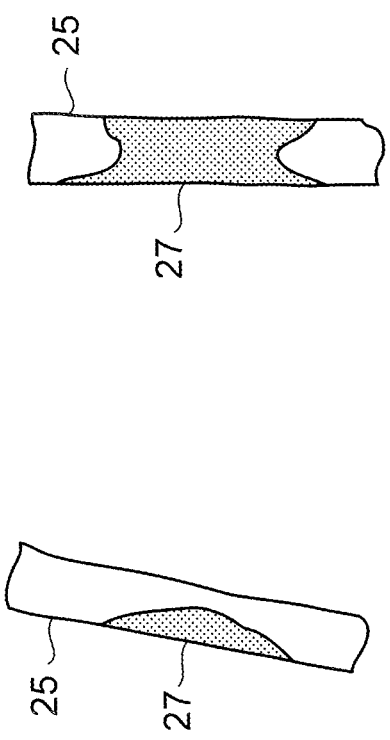
FIG.10C
T=5 MINUTES
FIG.10D
T=10 MINUTES
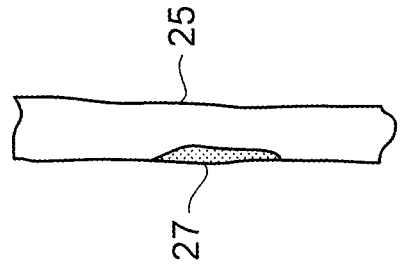

T=5 MINUTES

T=10 MINUTES

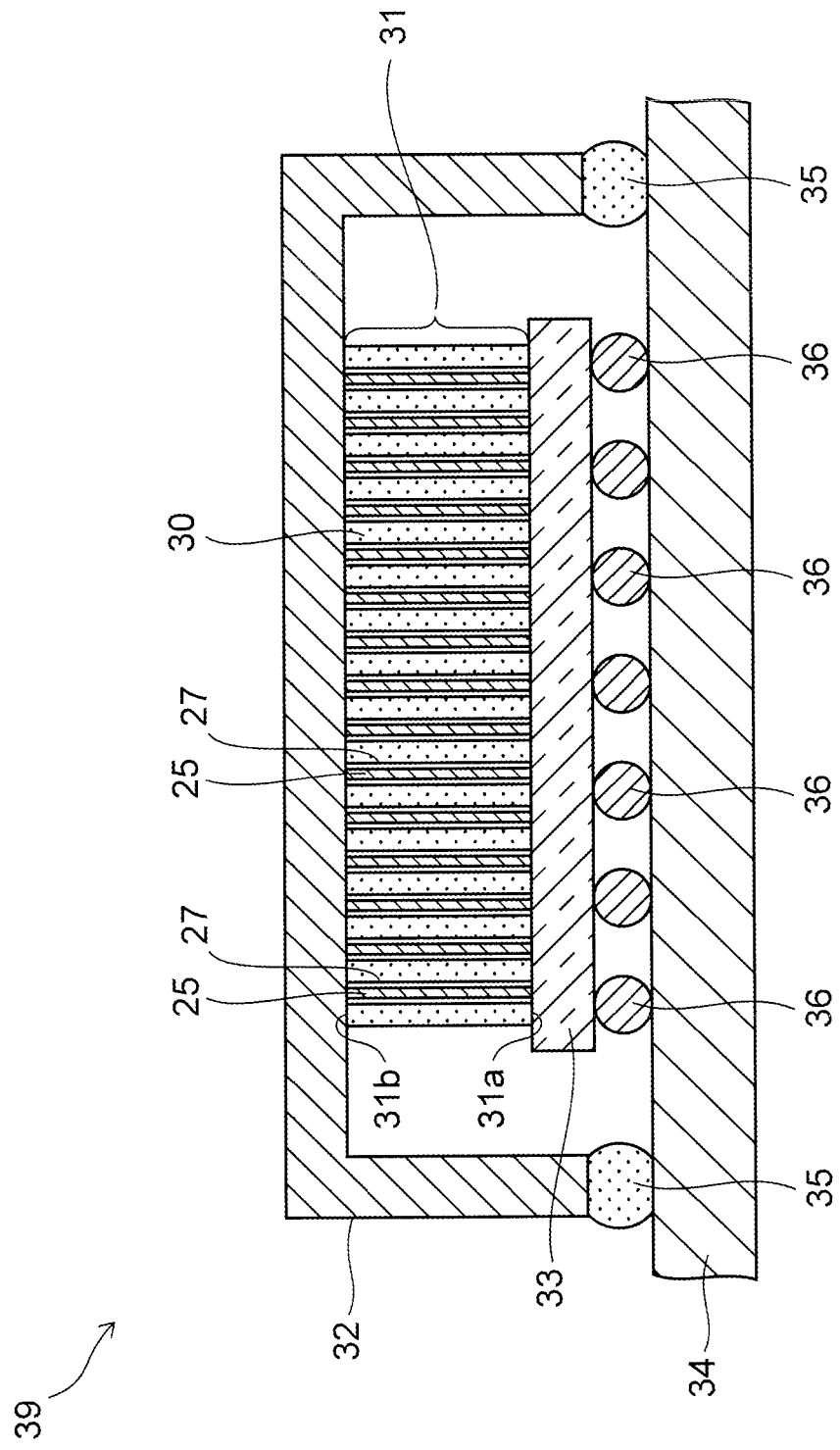

HEAT RADIATION SHEET, METHOD OF MANUFACTURING HEAT RADIATION SHEET, AND METHOD OF MANUFACTURING ELECTRONIC DEVICE

CROSS-REFERENCE TO RELATED APPLICATION

This application is based upon and claims the benefit of priority of the prior Japanese Patent Application No. 2014-228221, filed on Nov. 10, 2014, the entire contents of which are incorporated herein by reference.

FIELD

The embodiments discussed herein are related to a heat radiation sheet, a method of manufacturing a heat radiation sheet, and a method of manufacturing an electronic device.

BACKGROUND

In a server or a personal computer, a heat spreader is fastened to an electronic component such as a CPU (Central Processing Unit) to radiate heat generated by the electronic component to the outside.

If the thermal resistance between the heat spreader and the electronic component is high, it is not possible to rapidly transfer the heat of the electronic component to the heat spreader. For this reason, a heat radiation sheet having excellent thermal conductivity is sometimes provided between the electronic component and the heat spreader.

Various types of heat radiation sheets are available. An indium sheet is one example of the heat radiation sheets. Since an indium sheet uses expensive indium, it is difficult to reduce the cost of the heat radiation sheet.

In this respect, as a heat radiation sheet alternative to the indium sheet, a technology using carbon nanotubes has been investigated. In this technology, a plurality of carbon nanotubes are provided upright on a sheet to transport heat from one end to the other end of each carbon nanotube.

The carbon nanotubes have thermal conductivities of about 1500 W/m·K to 3000 W/m·K, which are higher than the thermal conductivity of indium (80 W/m·K). Hence, it is preferable to use carbon nanotubes for a heat radiation sheet.

The temperature of an electronic component in contact with a heat radiation sheet varies depending on the condition of use of the electronic component, and the electronic component deforms with the change in temperature. If the heat radiation sheet is excessively thin, the deformation of the electronic component causes the heat radiation sheet to be separated from the electronic component, making it difficult to transport heat from the electronic component to the heat radiation sheet.

To prevent this, it is effective that the thickness of the heat radiation sheet is increased to some degree by increasing the length of each carbon nanotube, and moreover the heat radiation sheet is brought into close contact with the electronic component by applying pressure at assembly.

However, when the length of the carbon nanotube is increased as described above, the carbon nanotube as a whole becomes soft. For this reason, there arises a possibility that the carbon nanotubes do not withstand the pressure at assembly and may collapse.

In addition, if the carbon nanotubes become soft as described above, there also arises a possibility that the carbon nanotubes do not follow the deformation of the electronic component with the change in temperature.

To avoid these problems, it is conceivable that the carbon nanotubes are coated with mechanically strong films to reinforce the carbon nanotubes. However, it is difficult to coat the entirety of a long carbon nanotube by an already-existing technology.

Note that technologies related to the present application are disclosed in Japanese Laid-open Patent Publication Nos. 06-5754, 2003-174127, 2013-211430, 2005-150362, 2006-147801, and 2006-303240.

SUMMARY

According to an aspect of the following disclosure, there is provided a method of manufacturing a heat radiation sheet, the method including, forming a base film on a substrate, growing a plurality of carbon nanotubes on the base film, and vaporizing at least a part of the base film by heating the base film to coat the carbon nanotube with a coating film containing a material of the vaporized base film.

In addition, according to another aspect of the disclosure, there is provided a method of manufacturing an electronic device, the method including, forming a base film on a substrate, growing a plurality of carbon nanotubes on the base film, vaporizing at least a part of the base film by heating the base film to coat the carbon nanotube with a coating film containing a material of the vaporized base film, after the coating, manufacturing a heat radiation sheet provided with the plurality of carbon nanotubes, and pressing a front surface and a back surface of the heat radiation sheet to an electronic component and a heat radiation member respectively and bonding the heat radiation sheet to the electronic component and the heat radiation member.

Moreover, according to still another aspect of the disclosure, there is provided a heat radiation sheet including a plurality of carbon nanotubes, and a coating film of silicon oxide formed on a side surface of the carbon nanotube and containing any of aluminum, titanium, tantalum, molybdenum, iron, cobalt, nickel, gold, silver, and platinum.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 7A and 7B are cross-sectional views of an electronic device in the course of manufacturing the same according to the first embodiment;

FIGS. 9A to 9D are diagrams depicted based on SEM (scanning electron microscope) images of roots of carbon nanotubes in the first embodiment;

FIGS. 10A to 10D are diagrams depicted based on SEM images of portions of carbon nanotubes around centers thereof in the first embodiment;

FIG. 15 is a cross-sectional view of an electronic device according to the second embodiment.

DESCRIPTION OF EMBODIMENTS

Prior to the description of embodiments, matters examined by the inventor of the present application are described.

Figure 1:
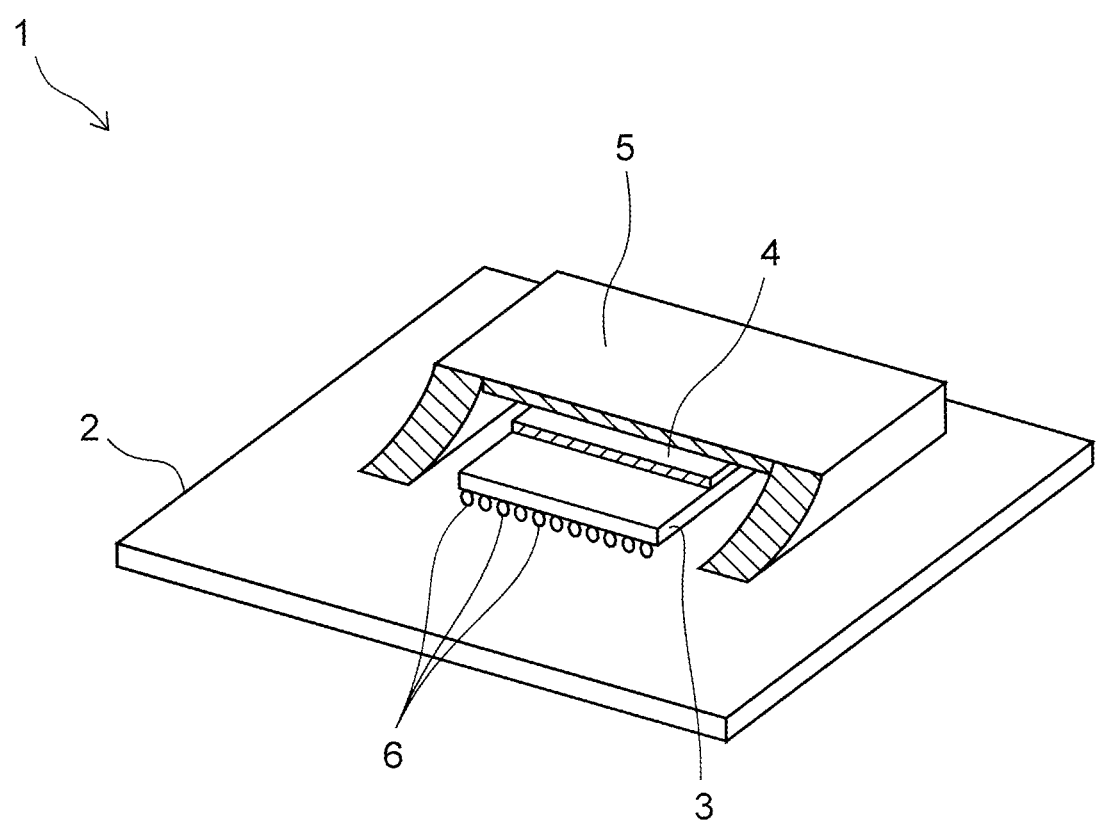
FIG. 1 is an exploded perspective view of an electronic device used for examinations.

FIG. 1 is an exploded perspective view of an electronic device used for the examinations.

This electronic device 1, which is used for a server or a personal computer, includes a wiring board 2 and an electronic component 3.

The electronic component 3 is a semiconductor component which generates heat in use, such as a CPU (central processing unit) or a GPU (graphical processing unit), and is mounted on the wiring board 2 by a plurality of solder bumps 6.

In addition, a heat radiation sheet 4 is provided on a top surface of the electronic component 3, and a heat spreader 5 is placed on the heat radiation sheet 4 in a close contact manner.

According to such a configuration, heat generated by the electronic component 3 is rapidly transferred to the heat spreader 5 through the heat radiation sheet 4, so that the cooling of the electronic component 3 may be promoted.

Figure 2:
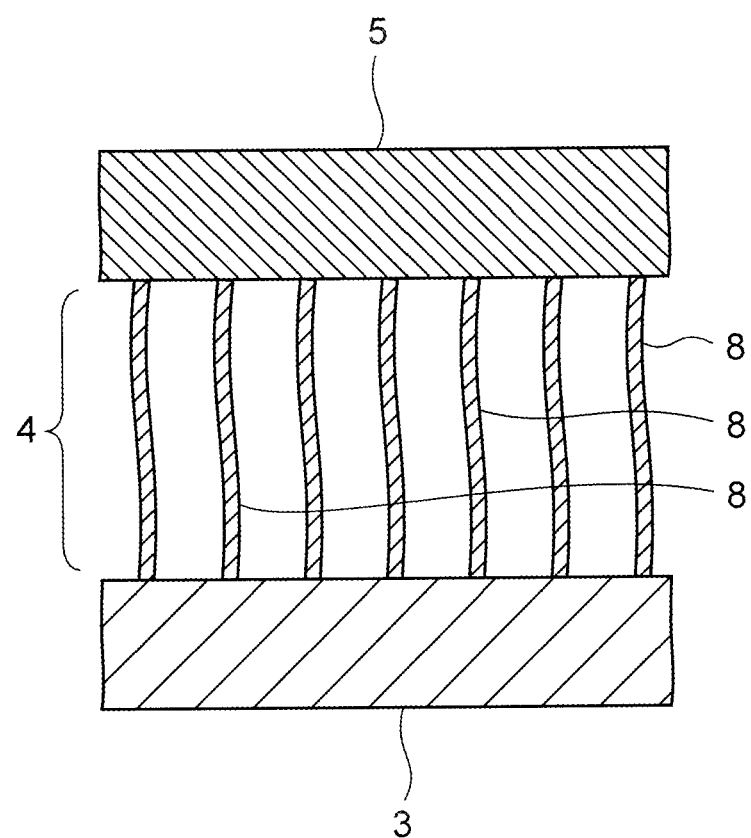
FIG. 2 is a schematic cross-sectional view of a heat radiation sheet used for the examinations.

FIG. 2 is a schematic cross-sectional view of the heat radiation sheet 4.

As illustrated in FIG. 2, the heat radiation sheet includes a plurality of carbon nanotubes 8 having excellent thermal conductivity. Heat is transferred from the electronic component 3 to the heat spreader 5 thorough the carbon nanotubes 8.

To efficiently transfer heat from the electronic component 3 to the heat spreader 5, both ends of each carbon nanotube 8 are preferably in contact with the electronic component 3 and the heat spreader 5, as illustrated in FIG. 2.

Figure 3:
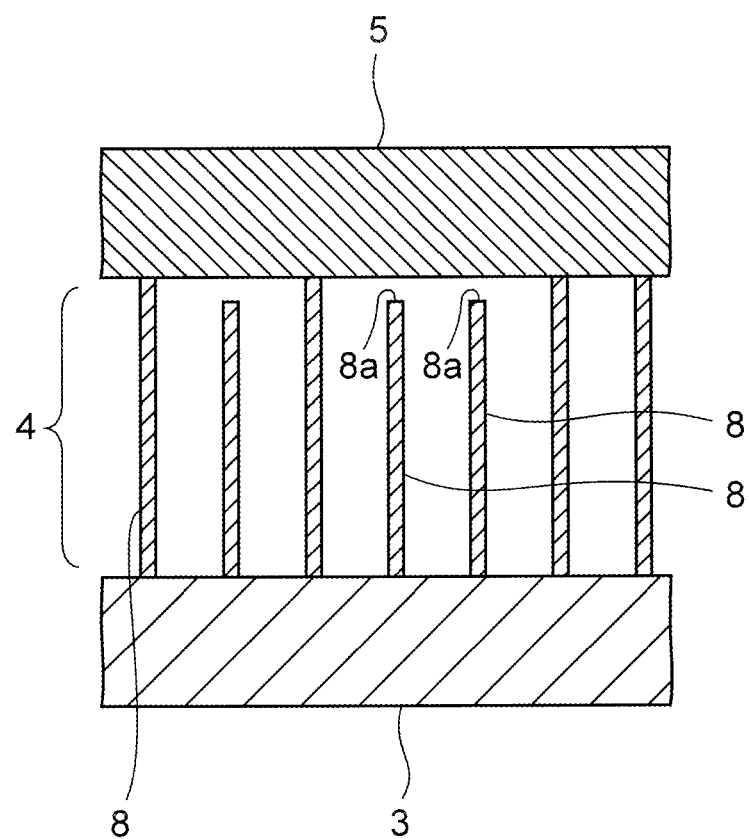
FIG. 3 is a cross-sectional view in which end portions of some of carbon nanotubes are separated from a heat spreader.

On the other hand, FIG. 3 is a cross-sectional view in which end portions 8a of some of the carbon nanotubes 8 are separated from the heat spreader 5. When the electronic component 3 deforms because of a change in temperature, the end portions 8a may be separated from the heat spreader 5 as described above in some cases.

Figure 4:
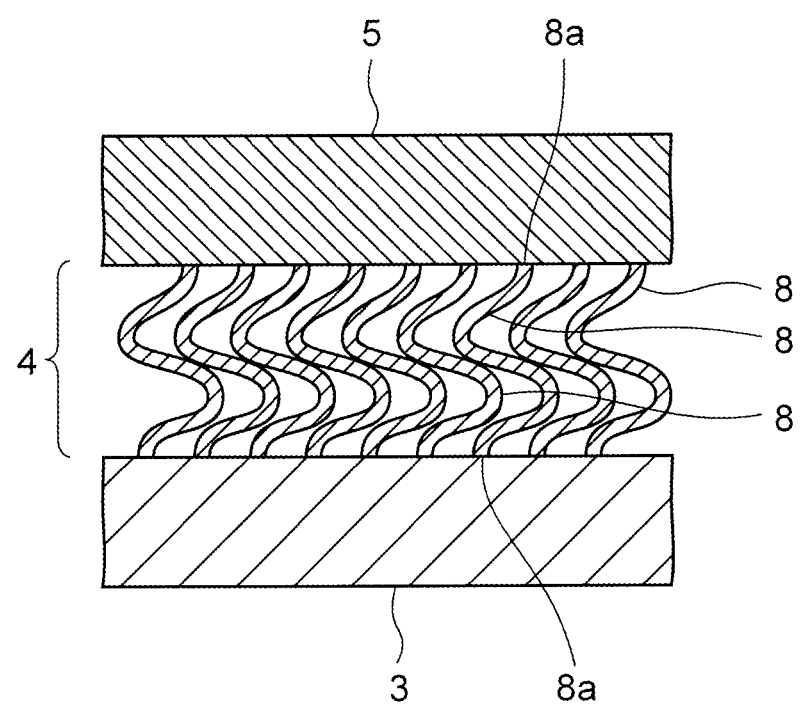
FIG. 4 is a schematic cross-sectional view for describing a method of preventing end portions of carbon nanotubes from being separated from a heat spreader.

FIG. 4 is a schematic cross-sectional view for describing a method of preventing such a problem.

In FIG. 4, an excess length is provided by increasing the length of each carbon nanotube 8, and moreover the carbon nanotubes 8 are contracted by the excess length by applying a pressure at the assembly of the electronic device 1. As a result, the elastic force of the carbon nanotubes 8 themselves brings the end portions 8a of the carbon nanotubes 8 into close contact with the electronic component 3 or the heat spreader 5.

To provide the carbon nanotubes 8 with such excess lengths that the end portions 8a may be brought into close contact with the electronic component 3 or the heat spreader 5, lengths of the carbon nanotubes 8 of 100 µm or less are insufficient, and the lengths of the carbon nanotubes 8 are preferably increased to about 150 µm to 500 µm.

However, when the lengths of the carbon nanotubes 8 are increased as described above, the carbon nanotubes 8 become soft, and there arises a possibility that the carbon nanotubes 8 do not withstand the pressure at the assembly and may collapse.

Moreover, since the carbon nanotubes 8 become soft as described above, there also arises a possibility that the carbon nanotubes 8 do not follow the deformation of the electronic component 3 with the change in temperature.

In this respect, the inventor of the present application conceives that the elasticity of the carbon nanotubes 8 will be increased by coating the carbon nanotubes 8 with mechanically strong films such as aluminum oxide films.

Figure 5:
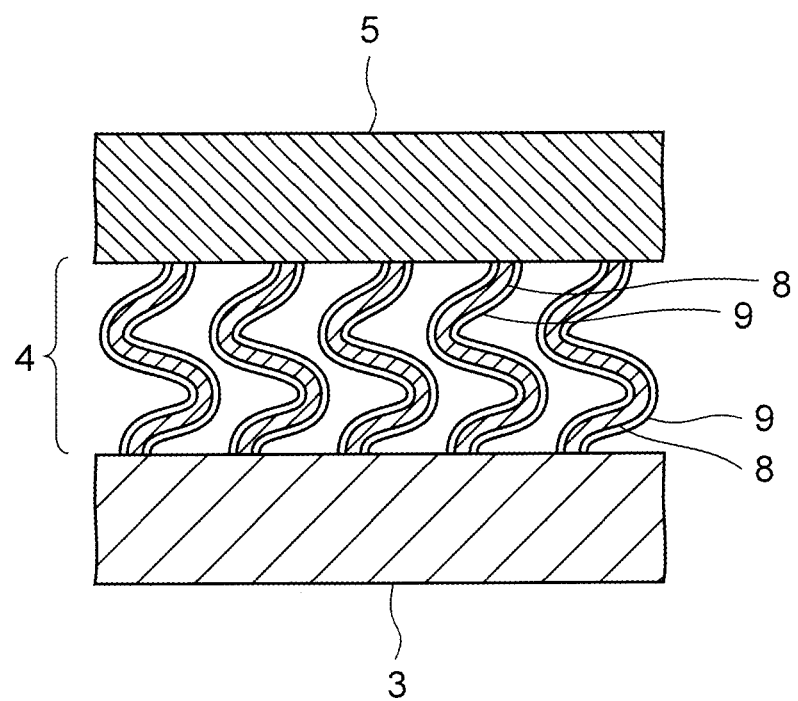
FIG. 5 is a cross-sectional view of a heat radiation sheet in which carbon nanotubes are coated with aluminum oxide films.

FIG. 5 is a cross-sectional view of a heat radiation sheet 4 in which the carbon nanotubes 8 are coated with aluminum oxide films 9.

Since the coating with the aluminum oxide films 9 increases the elasticity of the carbon nanotubes 8, it may be expected that the carbon nanotubes 8 may be prevented from being collapsed by the pressure at the assembly, and moreover the carbon nanotubes 8 may follow the deformation of the electronic component 3 with the change in temperature.

However, it is difficult to form the aluminum oxide film 9 uniformly over the entire length of each of the long carbon nanotubes 8 of 150 µm or longer. It is known that the use of the ALD method makes it possible to form an aluminum oxide film with excellent coating properties on a base with a high aspect ratio. However, based on an examination of the inventor of the present application, it is found that even when the aluminum oxide films 9 are formed by the ALD method, it is difficult to provide the long carbon nanotubes 8 with a sufficient elasticity.

Hereinafter, embodiments which make it possible to provide long carbon nanotubes with a sufficient elasticity are described.

First Embodiment

A heat radiation sheet according to this embodiment is described in the order of manufacturing steps thereof.

FIGS. 6A to 6F are cross-sectional views of a heat radiation sheet in the course of manufacturing the same according to this embodiment.

Figure 6A:
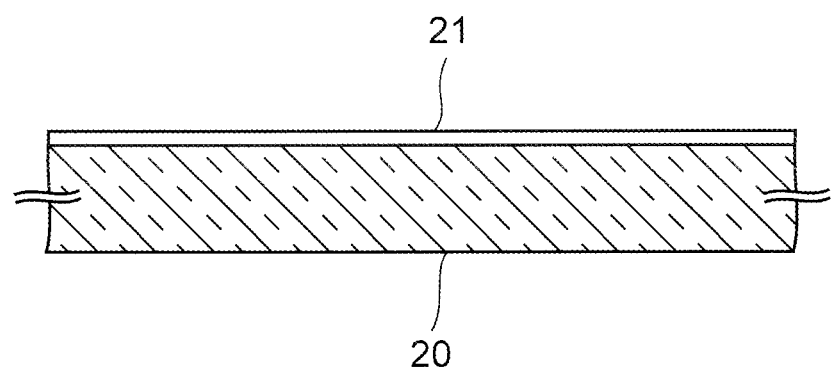
FIGS. 6A to 6F are cross-sectional views of a heat radiation sheet in the course of manufacturing the same according to a first embodiment.

First, as illustrated in FIG. 6A, a silicon substrate is provided as a substrate 20, and a surface of the substrate 20 is thermally oxidized to form a silicon oxide film having a thickness of about 300 nm as a base film 21.

The material of the substrate 20 is not limited to silicon, and it is also possible to use a substrate made of any of aluminum oxide, magnesium oxide, and glass.

Meanwhile, the base film 21 is not limited to a silicon oxide film, either. For example, it is also possible to form an aluminum oxide film or a silicon nitride film as the base film 21.

Figure 6B:
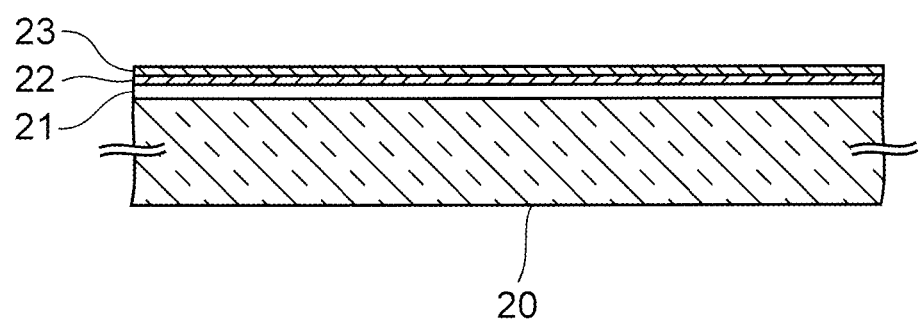

Next, as illustrated in FIG. 6B, an aluminum film is formed to a thickness of about 10 nm on the base film 21 by a sputtering method, and the aluminum film is employed as a metal base film 22.

Besides aluminum, materials of the metal base film 22 include molybdenum, titanium, hafnium, zirconium, niobium, vanadium, tantalum, tungsten, copper, gold, platinum, palladium, titanium silicide, aluminum oxide, titanium oxide, and titanium nitride. Moreover, a film of an alloy containing any of these materials may be formed as the metal base film 22.

Subsequently, an iron film is formed to a thickness of about 2.5 nm on the metal base film 22 by a sputtering method, and the iron film is employed as a catalytic metal film 23.

The material of the catalytic metal film 23 is not limited to iron. The catalytic metal film 23 may be formed of aluminum, titanium, tantalum, molybdenum, iron, cobalt, nickel, gold, silver, platinum, or an alloy of any of them.

Moreover, instead of the catalytic metal film 23, fine metal particles containing the same material as that of the catalytic metal film 23 may be attached onto the metal base film 22. In this case, as the fine metal particles, those having a predetermined diameter are collected in advance with a differential mobility analyzer or the like, and supplied onto the metal base film 22.

Figure 6C:
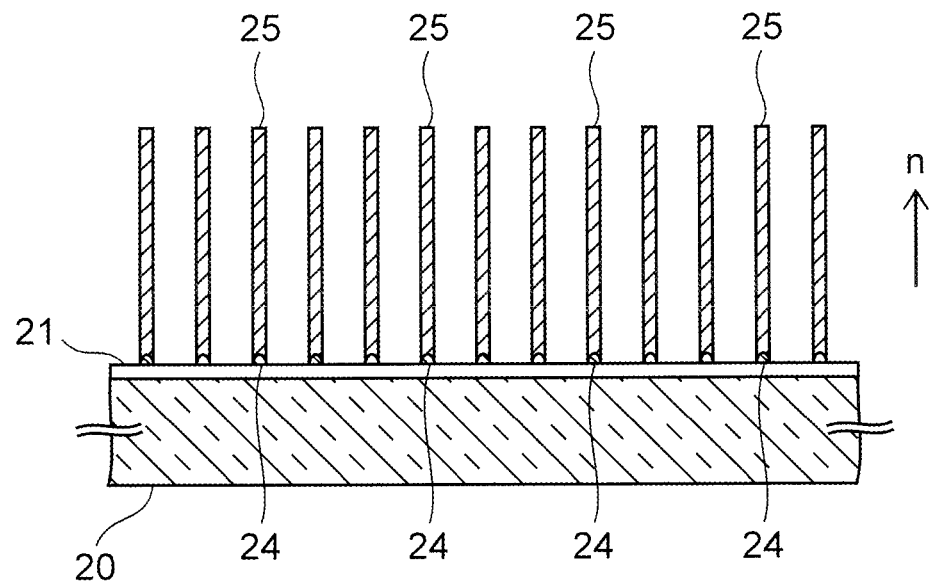

Subsequently, as illustrated in FIG. 6C, a plurality of carbon nanotubes 25 are grown by a hot-filament CVD (chemical vapor deposition) method utilizing a catalytic action of the catalytic metal film 23. The carbon nanotubes grow linearly in the normal line direction n to the substrate 20 because of an action of the base film 21.

Growing conditions of the carbon nanotubes 25 are not particularly limited. In this example, a gas mixture of ethylene gas and argon gas is used as a raw material gas, and the total gas pressure of the raw material gas is set to kPa in an unillustrated growth chamber. The partial pressure ratio of the ethylene gas to the argon gas is, for example, about 1:9. In addition, the temperature of the hot filament is about 1000° C.

Note that the metal base film 22 and the catalytic metal film 23 condense at the introduction of the raw material gas into the growth chamber to form metal particles 24 in a particulate form, and the carbon nanotubes 25 grow on the metal particles 24.

Under the growing conditions, the surface density of the carbon nanotubes 25 is approximately $1 \times 10^{11}$ tubes/cm$^2$, and the carbon nanotubes 25 have diameters of 4 nm to 8 nm with an average diameter of approximately 6 nm.

In addition, the growth rate is 4 μm/min, and the length of each carbon nanotube 25 is about 100 μm to 500 μm, which is suitable for a heat radiation sheet.

Note that, in each of the carbon nanotubes 25, about three to six single-walled graphene sheets are stacked on each other from a central axis thereof to the outside, and an average value of the numbers of the layers is about four. A carbon nanotube in which multiple graphene sheets are stacked as described above is also called a multi-walled carbon nanotube. Single-walled carbon nanotubes may be formed instead of the multi-walled carbon nanotubes.

The surface density of the carbon nanotubes 25 is not limited to the above-described one. To actually obtain a heat radiation effect of the carbon nanotubes 25, it is preferable to form the carbon nanotubes 25 with as high a surface density as possible, for example, with a surface density of $1 \times 10^{10}$ tubes/cm$^2$ or higher.

Moreover, a method of forming the carbon nanotubes 25 is not limited to the above-described hot-filament CVD method, and may be a thermal CVD method or a remote plasma CVD method. In addition, it is also possible to use a hydrocarbon such as methane or ethylene, or an alcohol such as ethanol or methanol as a raw material of carbon, instead of acetylene.

Figure 6D:
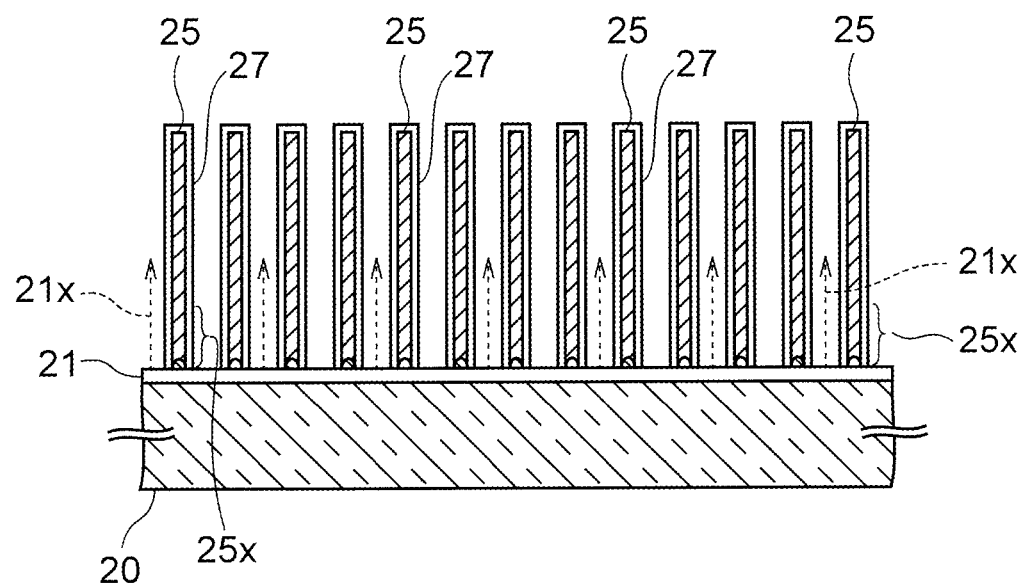

Next, as illustrated in FIG. 6D, the base film 21 is heated in a vacuum or an argon atmosphere to vaporize silicon oxide, which is a material 21x of the base film 21, from the base film 21. As a result, the material 21x is attached again onto surfaces of the carbon nanotubes 25, and each of the carbon nanotubes 25 is coated with a silicon oxide coating film 27.

The material 21x moves upward from roots 25x of the carbon nanotubes 25. Hence, the film thicknesses of the coating films 27 around the roots 25x are always sufficient, and the entirety of each carbon nanotube 25 including the root 25x may be coated with the coating film 27.

In addition, the coating films 27 increase the elasticity of the carbon nanotubes 25, and consequently the carbon nanotubes 25 are reinforced from their roots.

Note that, when the base film 21 is vaporized as described above, the catalytic metal film 23 (see FIG. 6B), from which the metal particles 24 are formed, also vaporizes. The coating film 27 hence contains not only silicon oxide, but also one of iron, cobalt, nickel, gold, silver, and platinum, which is the material of the catalytic metal film 23.

In addition, it is not important to vaporize all the base film 21 by heating, but it is important to vaporize at least part of the base film 21, for example, a surface layer portion of the base film 21. In addition, to vaporize the base film 21 as described above, for example, a resistance heater may be placed above the substrate 20 to heat the base film 21 with radiation heat of the heater.

Moreover, when an aluminum oxide film or a silicon nitride film is formed as the base film 21, the coating film 27 containing the material of the film is formed.

A heating profile of the base film 21 is not particularly limited.

Figure 8:
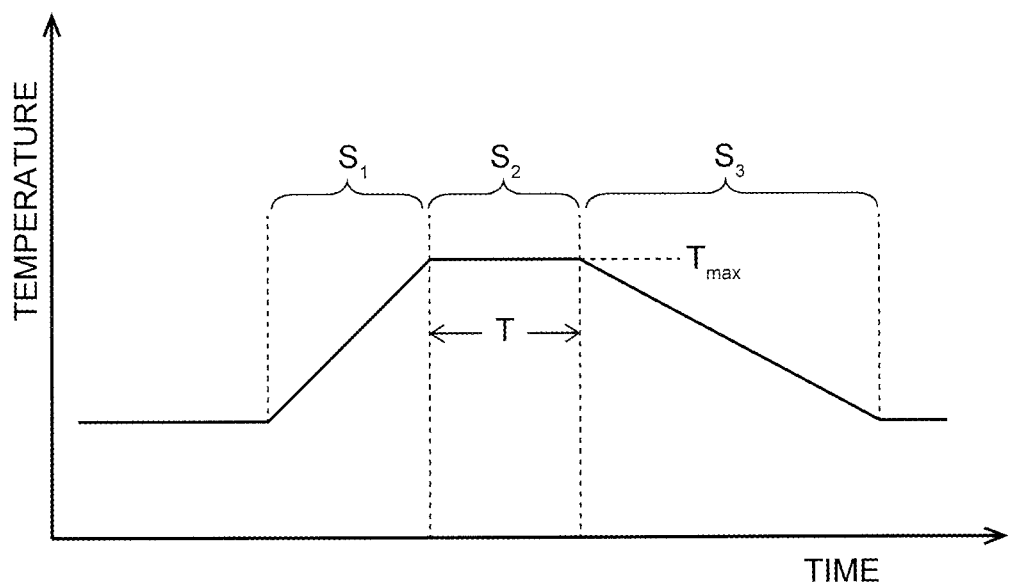
FIG. 8 is a graph illustrating an example of a heating profile of a base film in the first embodiment.

FIG. 8 is a graph illustrating an example of the heating profile.

In this example, a temperature-raising step S1 is conducted in which the temperature of the base film 21 is raised from room temperature (24° C. to 25° C.) at a rate of temperature rise of about 100° C./min. After that, a heating step S2 is conducted in which the base film 21 is held at a maximum temperature $T_{max}$. After that, in a temperature-lowering step S3, the base film 21 is cooled to room temperature at a rate of temperature drop of about 45° C./minute to 50° C./min.

Note that the maximum temperature $T_{max}$ is slightly higher than the melting point of the base film 21. When a silicon oxide film having a melting point of approximately 950° C. is formed as the base film 21, the maximum temperature $T_{max}$ may be set to about 1000° C. to 1010° C.

Moreover, a time T for which the base film 21 is held at the maximum temperature $T_{max}$ is a time in which the coating films 27 may be formed in such thicknesses that the carbon nanotubes 25 may be sufficiently reinforced, and the time T may be set to, for example, about 5 minute to 10 minutes.

Figure 6E:
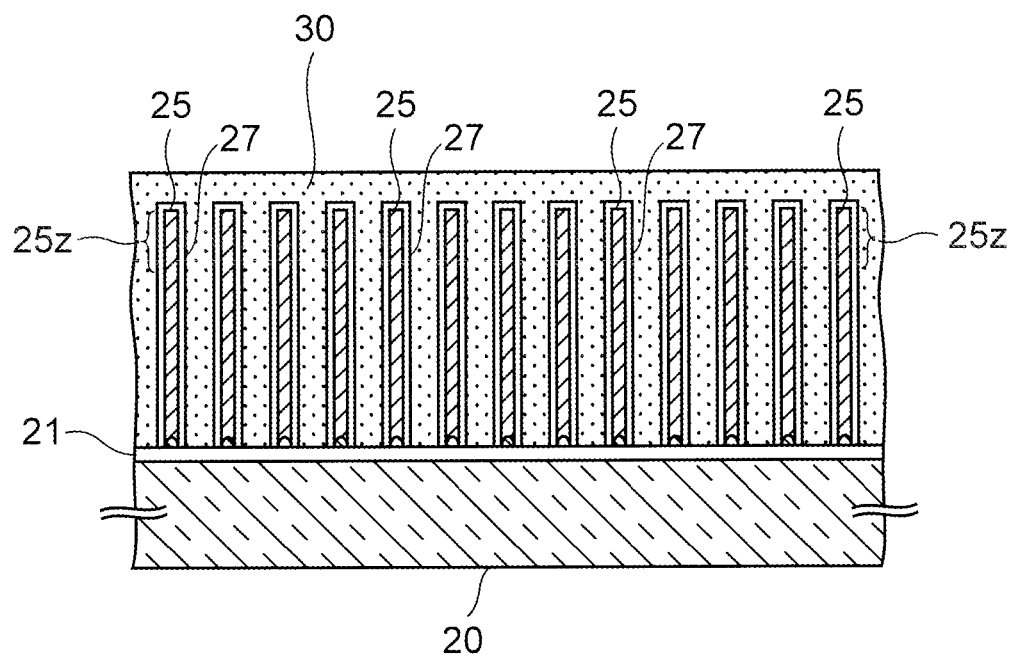

Next, as illustrated in FIG. 6E, a thermoplastic resin 30 is liquefied by heating the resin 30 to a temperature higher than its melting temperature, and spaces between the carbon nanotubes 25 are impregnated with the resin 30. For example, Micromelt 6239 hot melt filler having a melting temperature of 135° C. to 145° C. and manufactured by Henkel AG & Co. KGaA is used as the resin 30. This resin has a viscosity of about 5.5 Pa to 8.5 Pa at 225° C.

As a result, the front end 25z of each carbon nanotube 25 is covered with the resin 30.

Figure 6F:
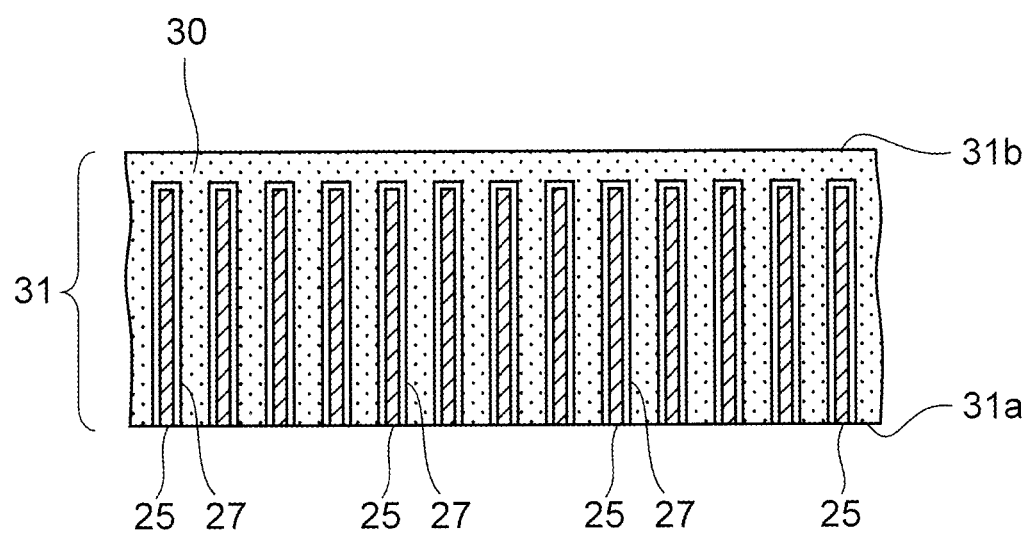

Subsequently, as illustrated in FIG. 6F, when the resin 30 is cooled to room temperature, the carbon nanotubes 25 and the resin 30 are detached from the base film 21 to obtain a heat radiation sheet 31 including the carbon nanotubes 25 and the resin 30.

Here, the resin 30 functions as a holding member which holds the plurality of carbon nanotubes 25. Hence, it is possible to prevent dispersal of the carbon nanotubes 25 at the detachment, and the heat radiation sheet 31 is easy to handle.

The thickness of the heat radiation sheet 31 is substantially equal to the length of each carbon nanotube 25, and is about 100 μm to 500 μm.

In addition, the heat radiation sheet 31 has a back surface 31a and a front surface 31b facing each other. The carbon nanotubes 25 extend from the back surface 31a to the front surface 31b. In addition, while the carbon nanotubes 25 are exposed on the back surface 31a, the carbon nanotubes 25 on the front surface 31b side are covered with the resin 30.

After this, steps of manufacturing an electronic device including the heat radiation sheet 31 are described.

Figure 7A:
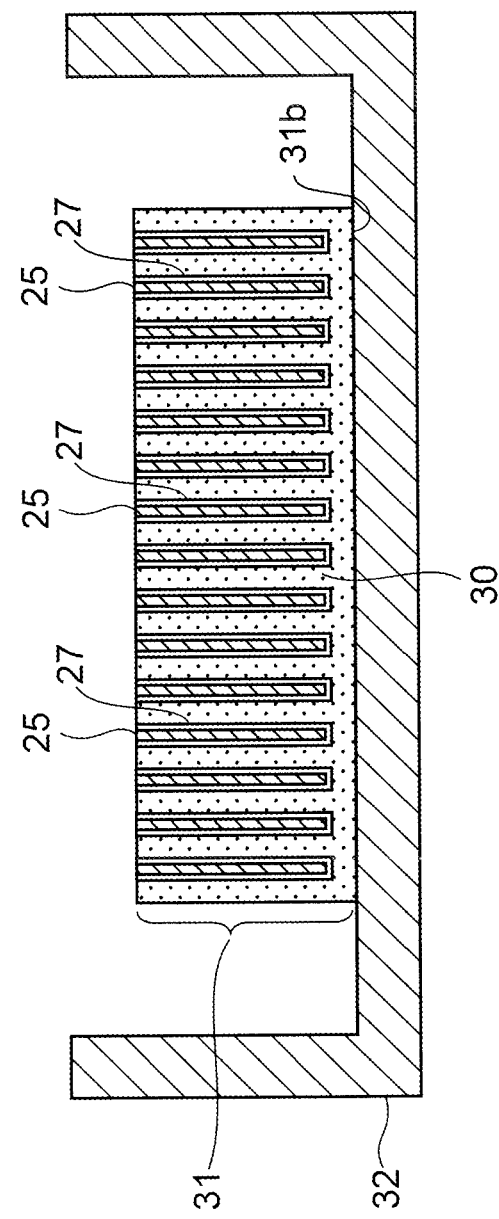

FIGS. 7A and 7B are cross-sectional views of an electronic device in the course of manufacturing the same according to this embodiment.

First, as illustrated in FIG. 7A, the resin 30 is softened to some degree by heating. By utilizing the adhesive force of the softened resin 30, the front surface 31b of the heat radiation sheet 31 is pressed to a heat radiation member 32, and the front surface 31b of the heat radiation sheet 31 is bonded to the heat radiation member 32. The heat radiation member 32 may be a heat spreader or a heat sink, and is made of, for example, a metal having excellent thermal conductivity, such as aluminum or copper.

Next, steps by which a cross-sectional structure illustrated in FIG. 7B is obtained are described.

First, a wiring board 34 is prepared to which a semiconductor element 33 is connected through solder bumps 36.

Then, the heat radiation member 32 is fixed to the wiring board 34 with a resin sealant 35.

Simultaneously, the resin 30 is softened by heating, and then the back surface 31a of the heat radiation sheet 31 is pressed to the semiconductor element 33, and the back surface 31a of the heat radiation sheet 31 is bonded to the semiconductor element 33 by utilizing the adhesive force of the softened resin 30. As a result of the pressing and bonding, the carbon nanotubes 25 are slightly contracted, and the heat radiation sheet 31 is brought into close contact with each of the heat radiation member 32 and the semiconductor element 33 by the elastic force of the carbon nanotubes 25.

Here, since the elasticity of the carbon nanotubes 25 is increased by the coating film 27 as described above, the carbon nanotubes 25 are not greatly collapsed by the pressure at the pressing and bonding, and the carbon nanotubes 25 may withstand the pressure at the compression-bonding.

Moreover, since the carbon nanotubes 25 are as long as 100 μm to 500 μm, the carbon nanotubes 25 are provided with excess lengths for contraction at the pressing and bonding. Hence, by contracting the carbon nanotubes 25 by the excess lengths, an elastic force may be always generated in the carbon nanotubes 25. Thus, even when the semiconductor element 33 deforms because of change in temperature in actual use, the heat radiation sheet 31 may follow the deformation.

As described above, a basic structure of an electronic device 39 according to this embodiment is completed.

According to the above-described embodiment, the carbon nanotubes 25 may be coated with the material of the base film 21 from the roots 25x of the carbon nanotubes 25 by vaporizing the base film 21 in the step of FIG. 6D, and the entirety of each carbon nanotube 25 including the root 25x may be reinforced uniformly.

Moreover, since the coating needs the heating of the base film 21, the elasticity of the carbon nanotubes 25 may be increased easily.

To check effects of this embodiment, the inventor of the present application conducts various examinations. Results of the examinations are described below.

First, the inventor of the present application observes carbon nanotubes 25 on which coating films 27 are formed as described above under a SEM (scanning electron microscope).

FIGS. 9A to 9D, FIGS. 10A to 10D, and FIGS. 11A and 11B are diagrams depicted based on the SEM images.

Note that the length of each carbon nanotube 25 is 200 μm.

FIGS. 9A to 9D are diagrams of roots 25x of carbon nanotubes 25. In this examination, the maximum temperature $T_{max}$ in FIG. 8 is set to 1000° C., and the time T of holding at the maximum temperature $T_{max}$ is set to 1 minute (FIG. 9A), 3 minutes (FIG. 9B), 5 minutes (FIG. 9C), or 10 minutes (FIG. 9D). The same maximum temperature $T_{max}$ and the same time T are also employed in FIGS. 10A to 10D described later.

As illustrated in FIGS. 9A to 9D, the coating film 27 made from the base film 21 is formed at the root 25x of each carbon nanotube 25.

FIGS. 10A to 10D are each a diagram of a portion of the carbon nanotube 25 around its center and above the root 25x.

As illustrated in FIGS. 10A to 10D, the coating film 27 is formed also around the center of each carbon nanotube 25.

Figure 11A:
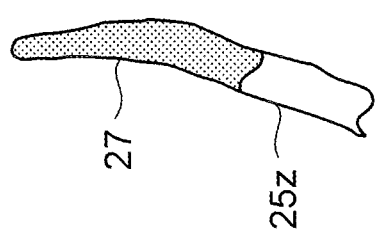
FIGS. 11A and 11B are diagrams depicted based on SEM images of front ends of carbon nanotubes in the first embodiment.
Figure 11B:
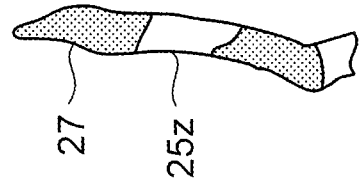

In addition, FIGS. 11A and 11B are diagrams of front ends 25z of carbon nanotubes 25.

For acquiring the SEM images of the front ends 25z, the maximum temperature $T_{max}$ in FIG. 8 is set to 1000° C., and the time T of holding at the maximum temperature $T_{max}$ is set to 5 minutes (FIG. 11A) or 10 minutes (FIG. 11B).

As illustrated in FIGS. 11A and 11B, the coating film 27 is formed also on the front end 25z of each carbon nanotube 25.

From the above-described results of the examinations of FIGS. 9A to 9D, FIGS. 10A to 10D, and FIGS. 11A and 11B, it is found that the coating films 27 may be formed on all of the roots 25x, the portions around their centers, and the front ends 25z of the carbon nanotubes 25 by vaporizing the base film 21 by heating.

Next, the inventor of the present application examines heat transfer characteristics of the carbon nanotubes 25 coated with the coating films 27.

Figure 12:
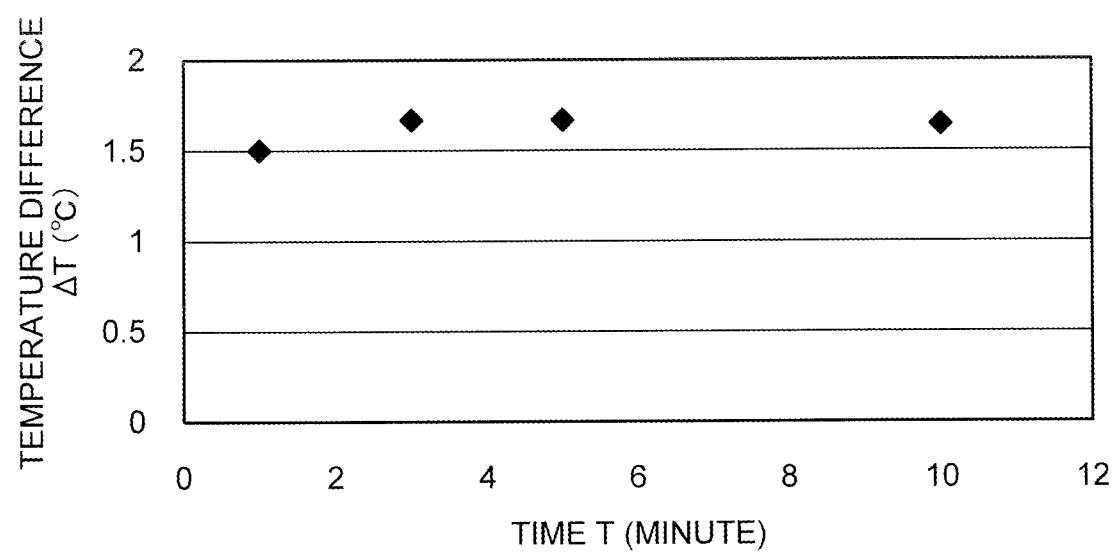
FIG. 12 is a graph obtained by examining heat transfer characteristics of carbon nanotubes in the first embodiment.

FIG. 12 illustrates the results of this examination.

In FIG. 12, the horizontal axis represents the time T of holding at the maximum temperature $T_{max}$ in FIG. 8. Meanwhile, the vertical axis represents the temperature difference A between the roots 25x and the front ends 25z in a case where the carbon nanotubes 25 are heated from the roots 25x.

A smaller temperature difference A indicates that heat is transferred more rapidly from the roots 25x to the front ends 25z, and the carbon nanotubes 25 have better heat transfer characteristics.

As illustrated in FIG. 12, when the time T is between 1 minute and 10 minutes, the temperature difference A does not greatly increase. This result reveals that the heat transfer characteristics of the carbon nanotubes 25 are not greatly impaired even when the carbon nanotubes 25 are coated with the coating films 27.

Moreover, the inventor of the present application examines mechanical properties of the carbon nanotubes 25 coated with the coating films 27.

Figure 13:
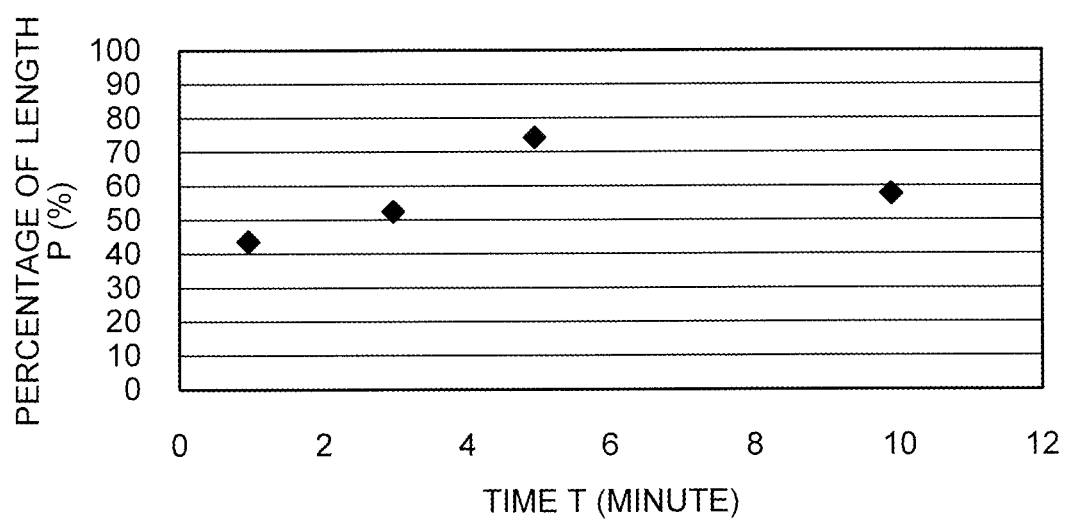
FIG. 13 is a graph obtained by examining mechanical properties of carbon nanotubes in the first embodiment.

FIG. 13 illustrates the results of this examination.

In FIG. 13, the horizontal axis represents the time T of holding at the maximum temperature $T_{max}$ in FIG. 8. Meanwhile, the vertical axis represents the percentage P of the length of the carbon nanotubes 25 after contraction to the length of the carbon nanotubes 25 before contraction in a case where the carbon nanotubes 25 are contracted by applying a pressure to the carbon nanotubes 25 in a longitudinal direction thereof.

A higher percentage P indicates that the carbon nanotubes 25 are more resistant to contraction, and the elasticity of the carbon nanotubes 25 is higher.

As illustrated in FIG. 13, the percentage P increases with the increase in the time T. Then, at a time T of about 5 minutes, the percentage P starts to decrease.

The percentage P is higher especially in each of the cases where the time T is 5 minutes or 10 minutes than in the case where the coating film 27 is formed by the ALD method. This reveals that the mechanical strength of the carbon nanotubes 25 increases more in a case where the coating films 27 are formed according to this embodiment than in a case of the ALD method.

Second Embodiment

In this embodiment, heat transfer thorough a heat radiation sheet is facilitated as follows.

FIGS. 14A to 14D are cross-sectional views of a heat radiation sheet in the course of manufacturing the same according to this embodiment.

Note that, in FIGS. 14A to 14D, the same elements as those described in the first embodiment are denoted by the same reference signs as those in the first embodiment, and descriptions thereof are omitted below.

Figure 14A:
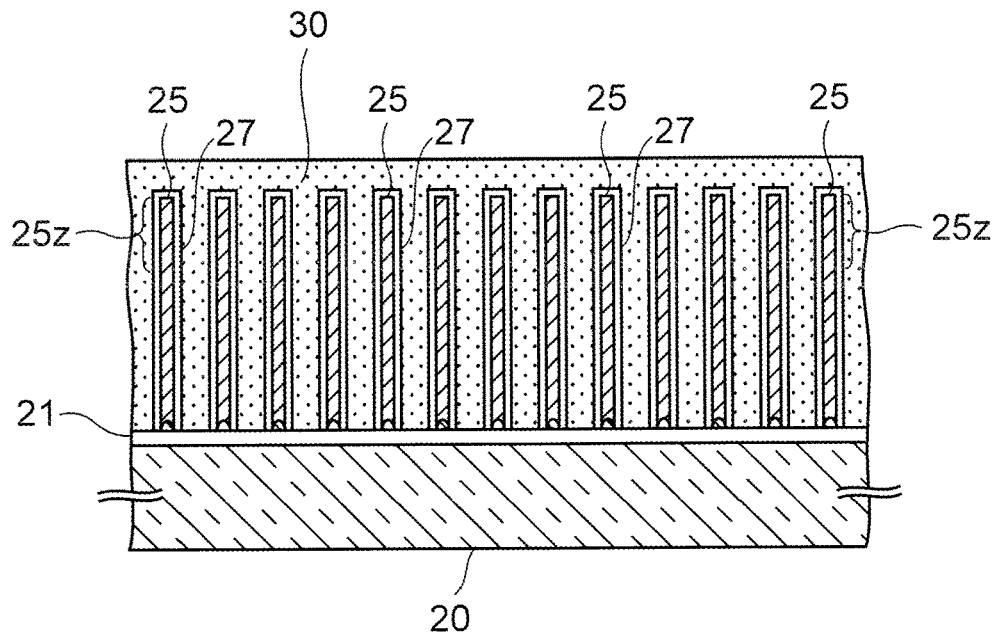
FIGS. 14A to 14D are cross-sectional views of a heat radiation sheet in the course of manufacturing the same according to a second embodiment.

First, by conducting the steps in FIGS. 6A to 6F of the first embodiment, a structure is manufactured in which the front end 25z of each carbon nanotube 25 is covered with the resin 30, as illustrated in FIG. 14A.

Figure 14B:
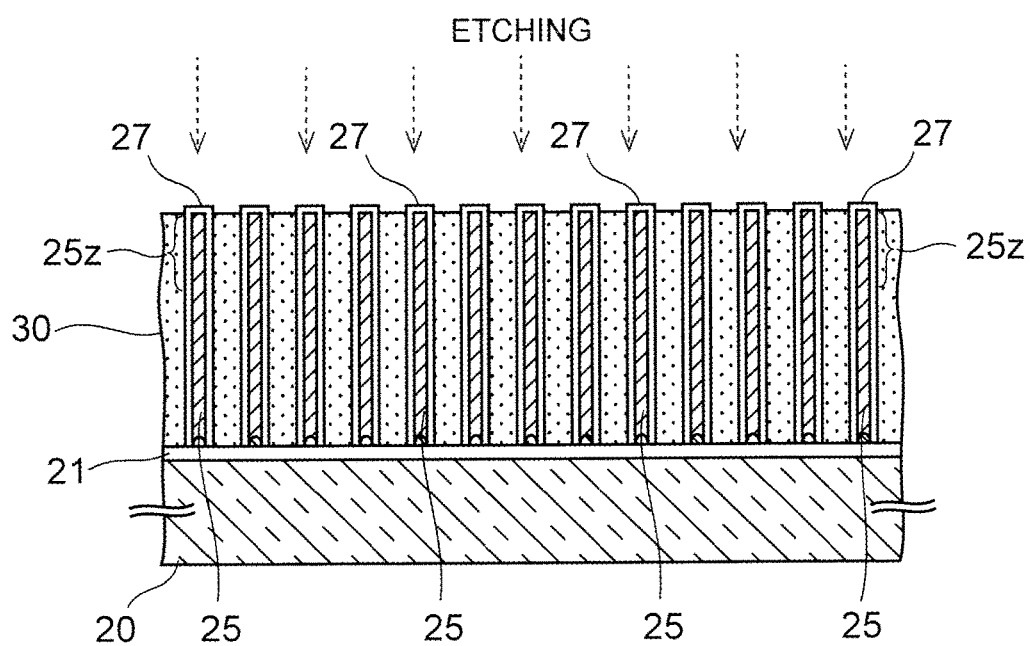

Subsequently, as illustrated in FIG. 14B, a surface of the resin 30 is dry etched with oxygen plasma to expose the coating films 27 formed on the front ends 25z of the carbon nanotubes 25 from the resin 30.

For example, this dry-etching is conducted for several minutes by holding the pressure of oxygen gas in an unillustrated etching chamber at 20 mTorr, and forming plasma from the oxygen gas with a high-frequency power of 50 W.

Under these etching conditions, the etching rate of the coating films 27 is lower than that of the resin 30, and hence the coating films 27 are left on the front ends 25z of the carbon nanotubes 25 at the completion of the etching.

Figure 14C:
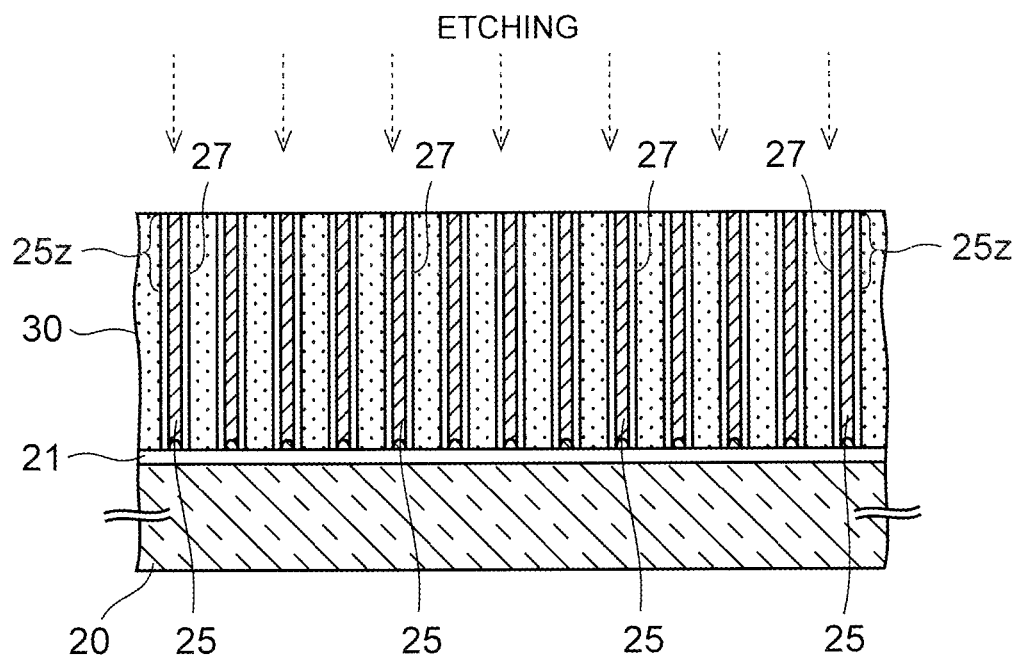

Subsequently, as illustrated in FIG. 14C, the coating films 27 formed on the front ends 25z of the carbon nanotubes 25 are etched by dry-etching using $CF_4$ gas as an etching gas to expose the front ends 25z from the resin 30.

Since the resin 30 functions as a mask against the $CF_4$ gas, portions of the coating films 27 formed on side surfaces of the carbon nanotubes 25 are protected from the etching atmosphere.

The conditions for this etching are not particularly limited. For example, this etching may be conducted for several minutes by holding the pressure of the $CF_4$ gas in an unillustrated etching chamber at 15 mTorr, and forming plasma from the $CF_4$ gas with a high-frequency power of 50 W.

Figure 14D:
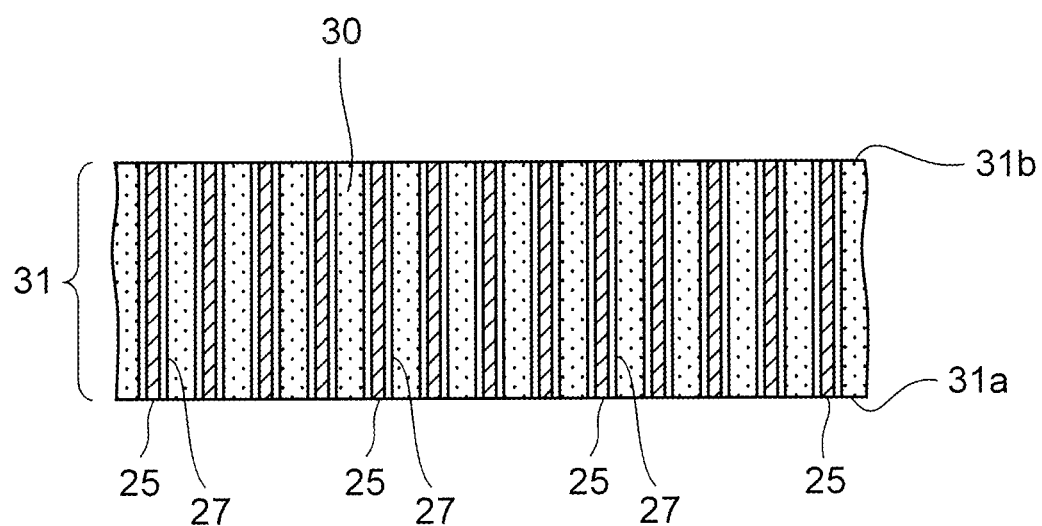

After that, as illustrated in FIG. 14D, the carbon nanotubes 25 and the resin 30 are detached from the base film 21 to obtain a heat radiation sheet 31 including the carbon nanotubes 25 and the resin 30.

In contrast to the first embodiment (see FIG. 6D) where the carbon nanotubes 25 are exposed on the back surface 31a, the carbon nanotubes 25 in this embodiment are exposed on both the back surface 31a and the front surface 31b of the heat radiation sheet 31.

After that, by conducting the steps of FIGS. 7A and 7B of the first embodiment, a basic structure of an electronic device 39 according to this embodiment is obtained as illustrated in a cross-sectional view of FIG. 15.

According to this embodiment described above, the carbon nanotubes 25 are exposed on both the back surface 31a and the front surface 31b of the heat radiation sheet 31. Hence, both the heat radiation member 32 and the semiconductor element 33 are in contact with the carbon nanotubes 25.

Accordingly, heat of the semiconductor element 33 is rapidly transferred to the heat radiation member 32 through the carbon nanotubes 25, so that the semiconductor element 33 may be cooled efficiently.

Third Embodiment

In each of the first and second embodiments, the spaces between the carbon nanotubes 25 are impregnated with the resin 30. However, the resin 30 may be omitted as follows.

FIGS. 16A to 16E are cross-sectional views of an electronic device in the course of manufacturing the same according to this embodiment. In FIGS. 16A to 16E, the same elements as those described in the first and second embodiments are denoted by the same reference signs as those in the embodiments, and descriptions thereof are omitted below.

Figure 16A:
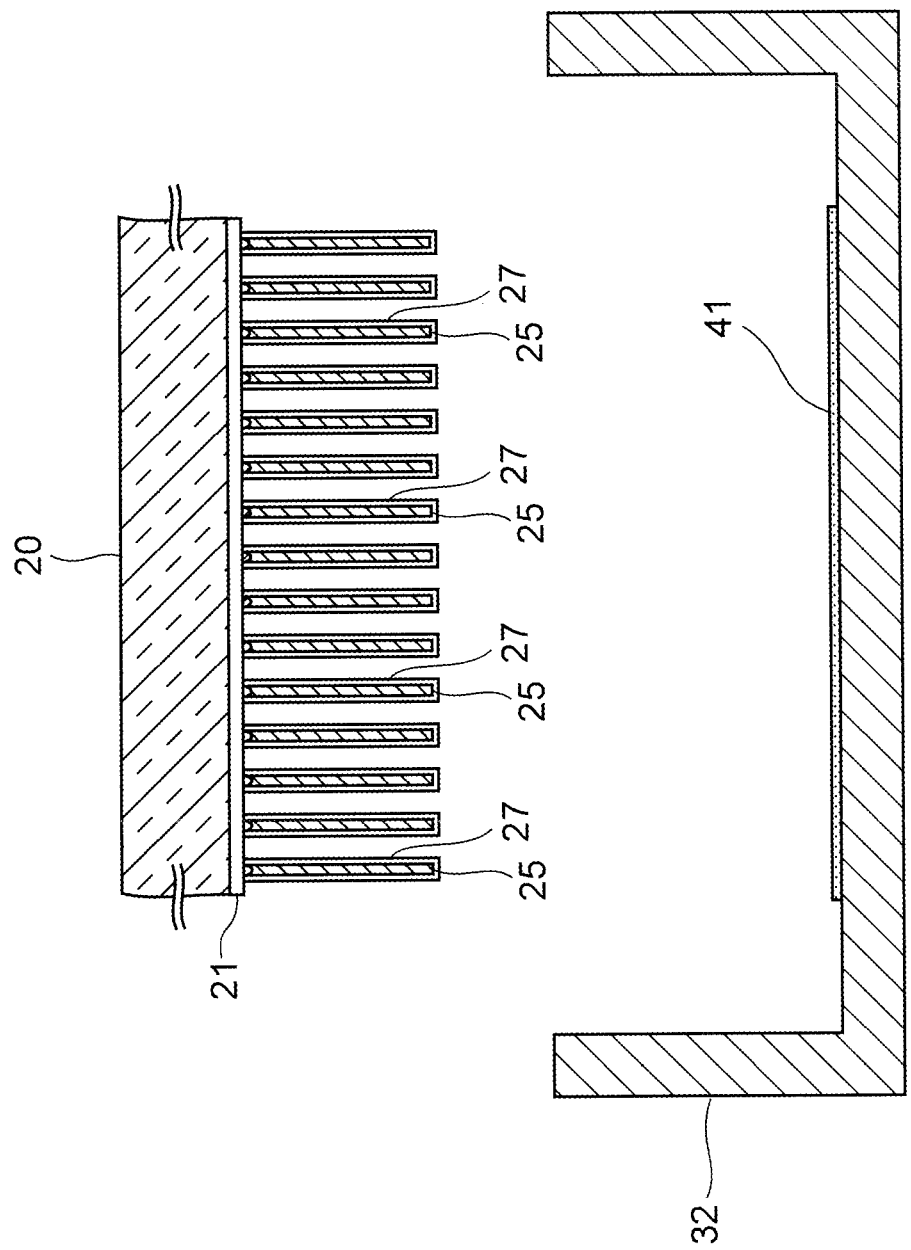
FIGS. 16A to 16E are cross-sectional views of an electronic device in the course of manufacturing the same according to a third embodiment.

First, by conducting the steps of FIGS. 6A to 6D of the first embodiment, a structure is obtained in which each carbon nanotube 25 is coated with the coating film 27 as illustrated in FIG. 16A.

In addition, a heat radiation member 32 is prepared, and an adhesive resin 41 is applied onto a surface of the heat radiation member 32.

Figure 16B:
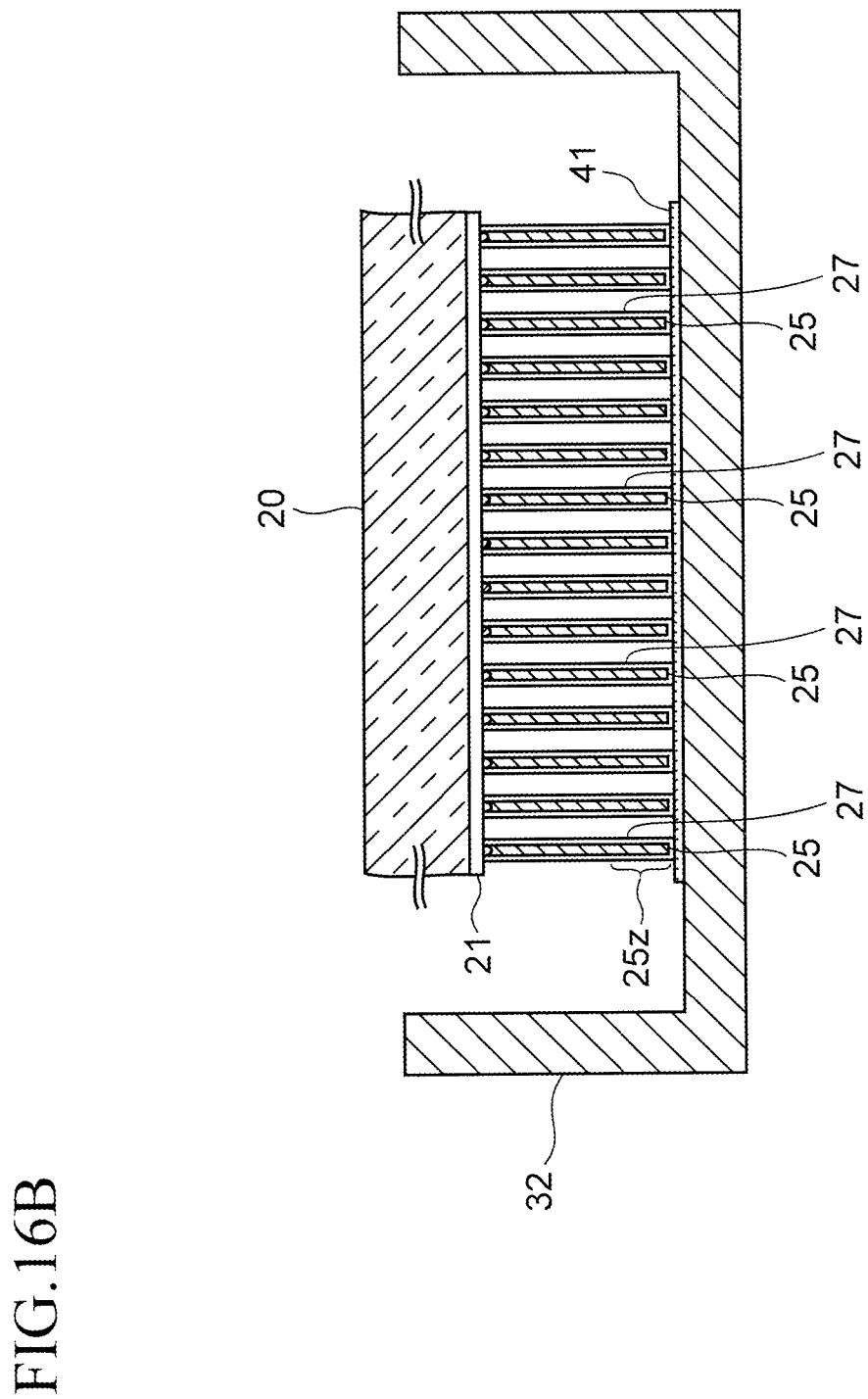

Subsequently, as illustrated in FIG. 16B, the coating films 27 formed on the front ends 25z of the carbon nanotubes 25 are brought into contact with the resin 41, and each carbon nanotube 25 is bonded to the heat radiation member 32 with the resin 41 placed therebetween.

Figure 16C:
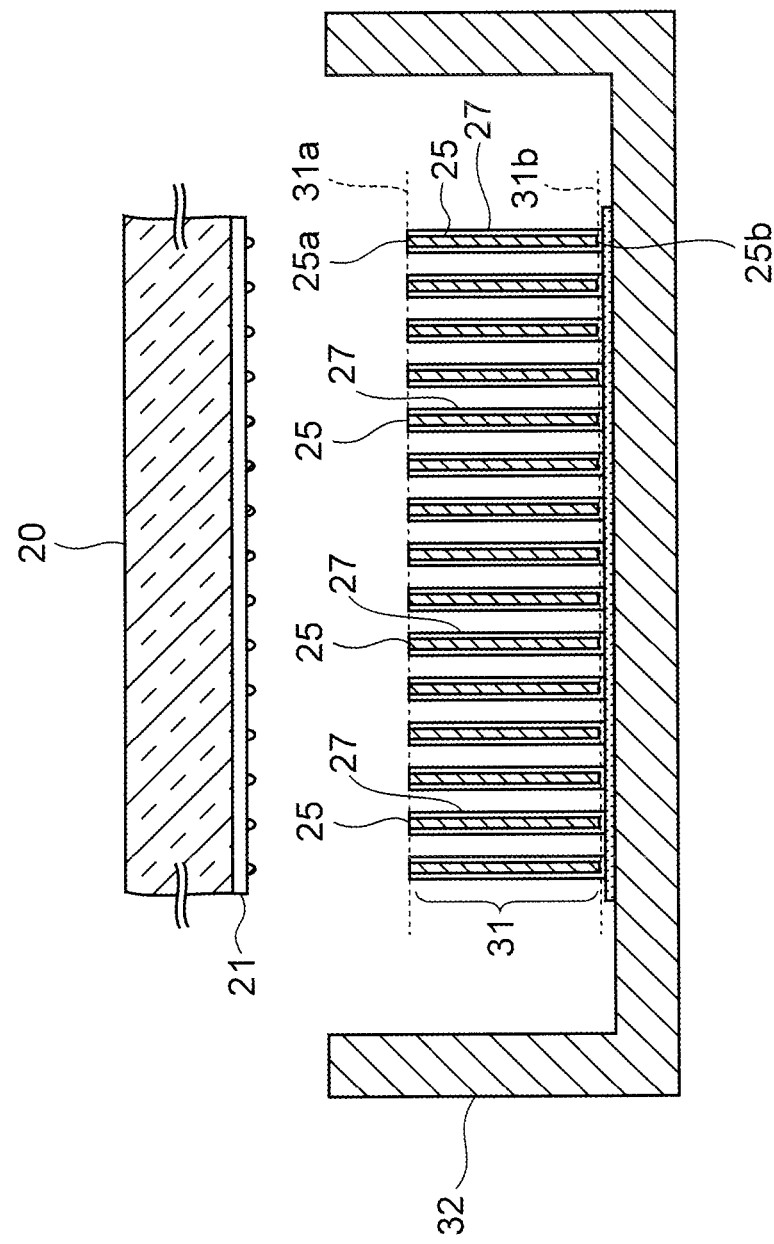

Then, as illustrated in FIG. 16C, the substrate 20 is lifted away from the heat radiation member 32 to detach the carbon nanotubes 25 from the base film 21. In this manner, a heat radiation sheet 31 including the plurality of carbon nanotubes 25 is left on the heat radiation member 32 side.

The heat radiation sheet 31 has a back surface 31a on which one end portion 25a of each carbon nanotube 25 is present, and a front surface 31b on which another end portion 25*b* of each carbon nanotube 25 are present. The carbon nanotubes 25 extend from the back surface 31*a* to the front surface 31*b*.

Figure 16D:
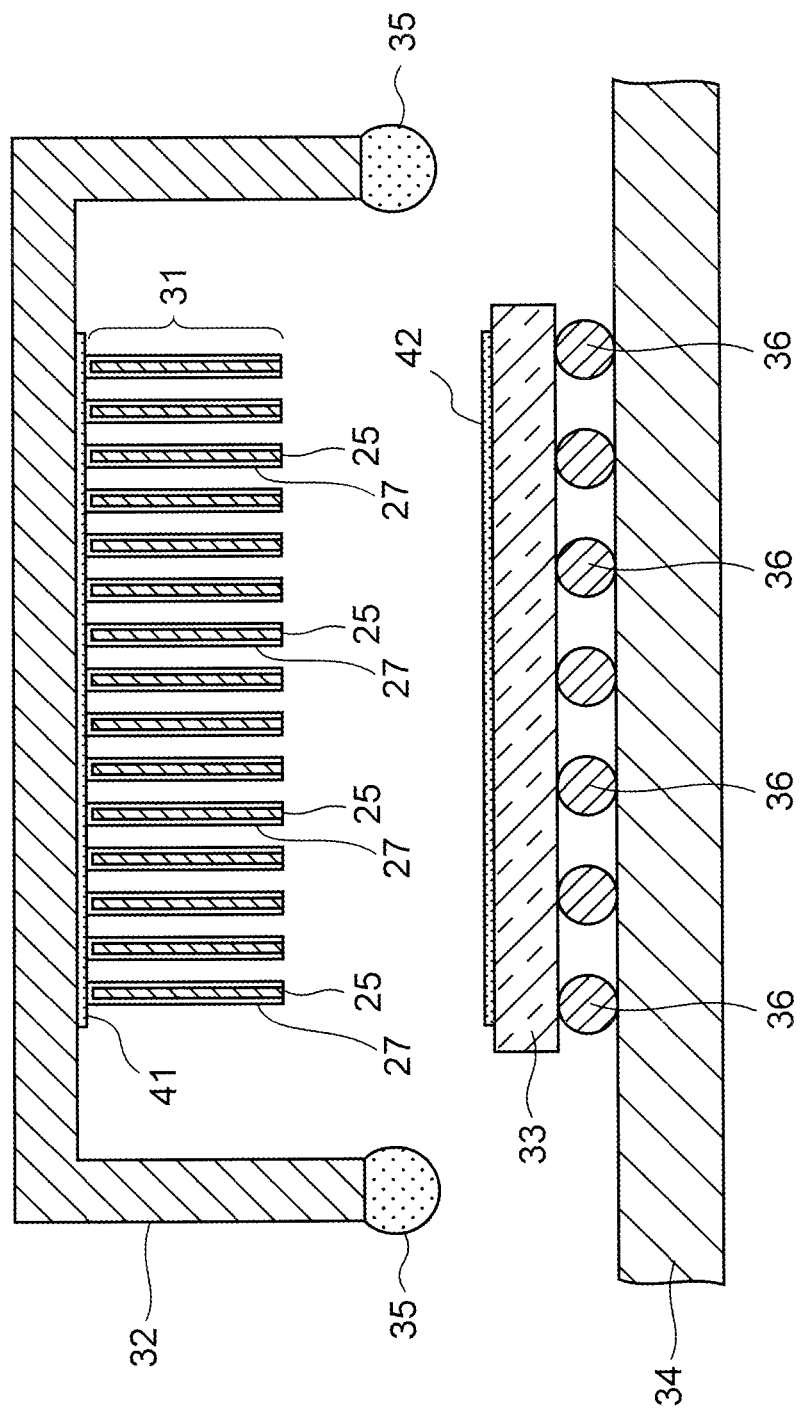

Subsequently, as illustrated in FIG. 16D, a wiring board 34 provided with a semiconductor element 33 is prepared, and an adhesive resin 42 is applied onto a surface of the semiconductor element 33.

Then, the heat radiation member 32 and the semiconductor element 33 are positioned with respect to each other to position the heat radiation sheet 31 above the semiconductor element 33.

Note that a sealant 35 is provided in advance to an edge of the heat radiation member 32.

Figure 16E:
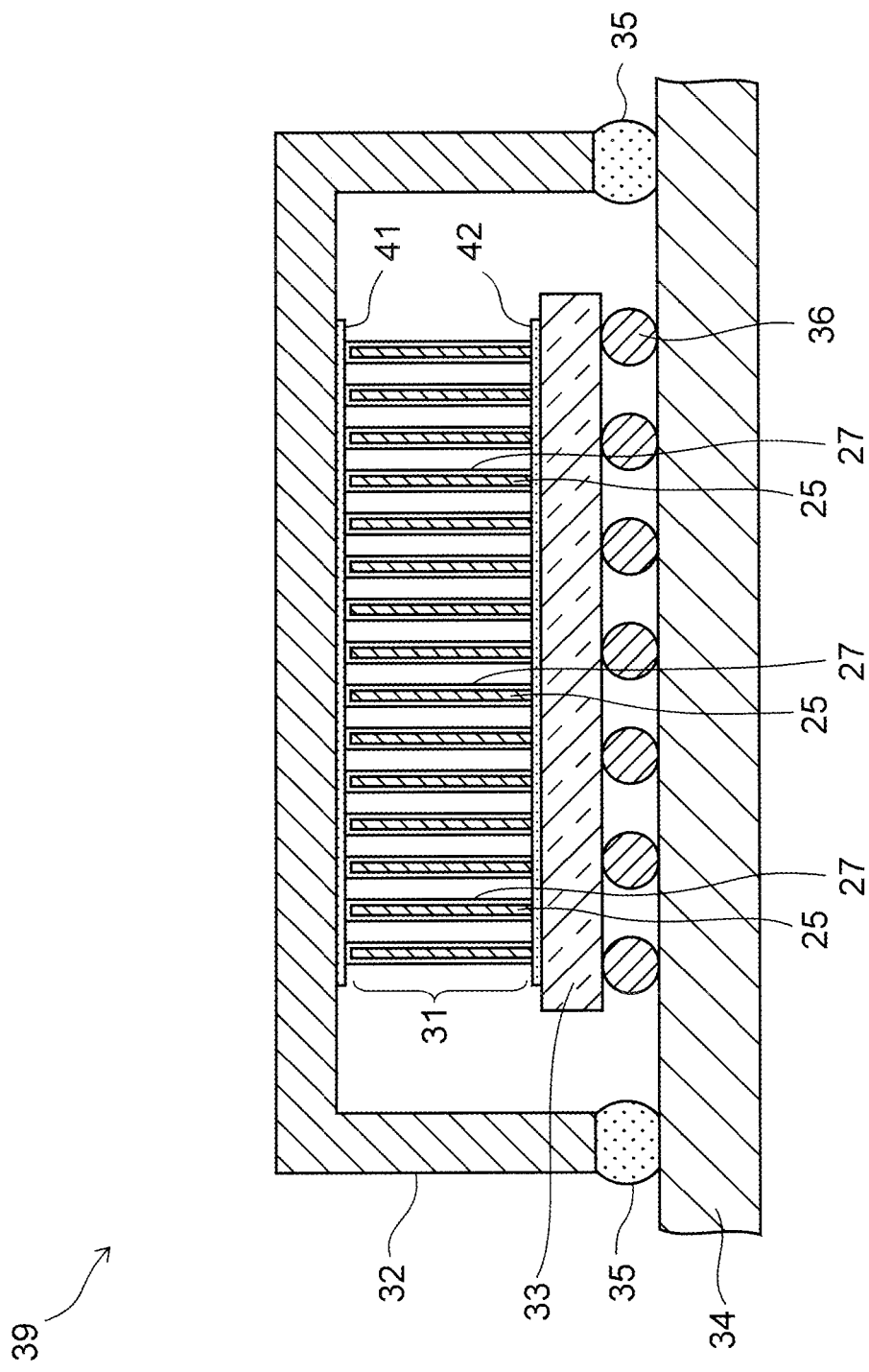

After that, as illustrated in FIG. 16E, by lowering the heat radiation member 32 to the semiconductor element 33, each carbon nanotube 25 of the heat radiation sheet 31 is pressed to the resin 42, and each carbon nanotube 25 of the heat radiation sheet 31 is bonded to the semiconductor element 33 by the resin 42.

Even when the pressing and bonding are conducted in this manner, each carbon nanotube 25 is prevented from being collapsed greatly, because the elasticity of the carbon nanotube 25 is increased by the coating film 27.

As described above, a basic structure of the electronic device 39 according to this embodiment is obtained.

According to this embodiment described above, even when the semiconductor element 33 deforms because of change in temperature, each carbon nanotube 25 having elasticity increased by the coating film 27 may follow the deformation of the semiconductor element 33, and heat of the semiconductor element 33 may be radiated to the heat radiation member 32 through the carbon nanotubes 25.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A method of manufacturing a heat radiation sheet, the method comprising:
    forming a silicon oxide film on a substrate;
    growing a plurality of carbon nanotubes on the silicon oxide film so that each of the plurality of carbon nanotubes extends in a direction perpendicular to a surface of the silicon oxide film;
    heating the silicon oxide film to a temperature higher than a melting point of the silicon oxide film to vaporize at least a part of the silicon oxide film;
    holding the silicon oxide film at the temperature until a vaporized material of the silicon oxide film part is attached to both a top surface and a side surface of each of the plurality of carbon nanotubes; and
    cooling the silicon oxide film to room temperature to form a coating film on the plurality of carbon nanotubes from the vaporized material of the silicon oxide film part, so that the coating film covers the top surface and the side surface of each of the plurality of carbon nanotubes.

2. The method of manufacturing a heat radiation sheet according to claim 1, the method further comprising:
    impregnating spaces between the plurality of carbon nanotubes with a resin after the formation of the coating film,
    wherein the resin covers the coating film formed on the top surface of each of the plurality of carbon nanotubes.

3. The method of manufacturing a heat radiation sheet according to claim 2, the method further comprising:
    etching a part of the resin to expose the coating film formed on the top surface of each of the plurality of carbon nanotubes while remaining other parts of the resin impregnating the spaces between the plurality of carbon nanotubes; and
    etching the coating film formed on the top surface of each of the plurality of carbon nanotubes with the resin being used as a mask to expose the top surface of each of the plurality of carbon nanotubes from the coating film.

4. A method of manufacturing an electronic device, the method comprising:
    forming a silicon oxide film on a substrate;
    growing a plurality of carbon nanotubes on the silicon oxide film so that each of the plurality of carbon nanotubes extends in a direction perpendicular to a surface of the silicon oxide film;
    heating the silicon oxide film to a temperature higher than a melting point of the silicon oxide film to vaporize at least a part of the silicon oxide film;
    holding the silicon oxide film at the temperature until a vaporized material of the silicon oxide film part is attached to both a top surface and a side surface of each of the plurality of carbon nanotubes;
    cooling the silicon oxide film to room temperature to form a coating film on the plurality of carbon nanotubes from the vaporized material of the silicon oxide film part, so that the coating film covers the top surface and the side surface of each of the plurality of carbon nanotubes;
    manufacturing a heat radiation sheet including the plurality of carbon nanotubes each having the top and side surfaces coated with the coating film; and
    pressing a back surface and a front surface of the heat radiation sheet to an electronic component and a heat radiation member respectively so that the heat radiation sheet is bonded to both the electronic component and the heat radiation member.

5. The method of manufacturing an electronic device according to claim 4, wherein
    the manufacturing the heat radiation sheet includes:
    impregnating spaces between the plurality of carbon nanotubes with a resin; and
    after the impregnating with the resin, detaching the resin and the plurality of carbon nanotubes from the silicon oxide film to form the heat radiation sheet including the resin and the carbon nanotubes.

6. The method of manufacturing an electronic device according to claim 5, wherein
    the pressing and bonding the heat radiation sheet includes:
    heating to soften the resin and bonding the resin to the electronic component; and
    heating to soften the resin and bonding the resin to the heat radiation member.

7. The method of manufacturing an electronic device according to claim 4, wherein
    the manufacturing the heat radiation sheet is conducted by detaching the plurality of carbon nanotubes from the silicon oxide film to form the heat radiation sheet including the plurality of detached carbon nanotubes.

\* \* \* \* \*